United States Patent
Park et al.

(10) Patent No.: US 8,614,148 B2
(45) Date of Patent: Dec. 24, 2013

(54) METHODS FOR FORMING FINE PATTERNS OF A SEMICONDUCTOR DEVICE

(71) Applicant: Samsung Electronics Co., Ltd., Suwon-Si (KR)

(72) Inventors: Joon-Soo Park, Seongnam-si (KR); Jongchul Park, Seongnam-si (KR); Cheolhong Kim, Yongin-si (KR); Seokwoo Nam, Seongnam-si (KR); Kukhan Yoon, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/733,376

(22) Filed: Jan. 3, 2013

(65) Prior Publication Data

US 2013/0260562 A1 Oct. 3, 2013

(30) Foreign Application Priority Data

Mar. 28, 2012 (KR) .......................... 10-2012-0031881

(51) Int. Cl.
*H01L 21/02* (2006.01)

(52) U.S. Cl.
USPC ........... 438/696; 438/694; 438/700; 438/703; 257/E21.258

(58) Field of Classification Search
USPC .................................. 438/694, 696, 700, 703
See application file for complete search history.

(56) References Cited

U.S. PATENT DOCUMENTS

| | | | |
|---|---|---|---|
| 5,702,968 A | 12/1997 | Chen | |
| 6,300,238 B1 | 10/2001 | Lee et al. | |
| 7,205,241 B2 | 4/2007 | Park et al. | |
| 7,618,860 B2 | 11/2009 | Lee | |
| 7,737,039 B2 | 6/2010 | Sandhu et al. | |
| 7,851,350 B2 | 12/2010 | Cho et al. | |
| 2004/0127050 A1 | 7/2004 | Park et al. | |
| 2004/0266098 A1* | 12/2004 | Huang et al. | 438/243 |
| 2007/0072407 A1* | 3/2007 | Kim et al. | 438/618 |
| 2007/0101211 A1 | 5/2007 | Chiang et al. | |
| 2008/0003800 A1 | 1/2008 | Lee | |
| 2009/0098732 A1 | 4/2009 | Cho et al. | |
| 2009/0115064 A1 | 5/2009 | Sandhu et al. | |
| 2010/0124817 A1* | 5/2010 | Kim et al. | 438/586 |
| 2011/0081778 A1* | 4/2011 | Lee et al. | 438/675 |
| 2011/0124196 A1* | 5/2011 | Lee | 438/696 |
| 2012/0184106 A1* | 7/2012 | Juengling | 438/703 |
| 2012/0252185 A1* | 10/2012 | Lee et al. | 438/424 |
| 2012/0282751 A1* | 11/2012 | Oh et al. | 438/382 |
| 2013/0178067 A1* | 7/2013 | YU et al. | 438/699 |

FOREIGN PATENT DOCUMENTS

| | | |
|---|---|---|
| KR | 19980011914 A | 4/1998 |
| KR | 19990057324 A | 7/1999 |
| KR | 20010086687 A | 9/2001 |

* cited by examiner

*Primary Examiner* — Alexander Ghyka
(74) *Attorney, Agent, or Firm* — Harness, Dickey & Pierce, P.L.C.

(57) ABSTRACT

A method may include forming first hard mask patterns and second hard mask patterns extending in a first direction and repeatedly and alternately arranged on a lower layer, forming third mask patterns extending in a second direction perpendicular to the first direction on the first and second hard mask patterns, etching the first hard mask patterns using the third mask patterns to form first openings, forming filling patterns filling the first openings and gap regions between the third mask patterns, forming spacers on both sidewalls of each of the filling patterns, after removing the third mask patterns, and etching the second hard mask patterns using the filling patterns and the spacers to form second openings.

20 Claims, 19 Drawing Sheets

METHODS FOR FORMING FINE PATTERNS OF A SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0031881, filed on Mar. 28, 2012, the entirety of which is incorporated by reference herein.

BACKGROUND

1. Field

Some example embodiments of the inventive concepts relate to methods for forming fine patterns of a semiconductor device and, more particularly, to methods for forming fin patterns arranged in zigzag form.

2. Description of the Related Art

As semiconductor devices become highly integrated, patterns in the semiconductor devices become fine. For integrating many elements in a limited area, reducing a size of each of the elements as much as possible is required. To achieve this, reducing a pitch and a distance between the patterns is required, the pitch being a sum of a width of the pattern. Recently, as a design rule of the semiconductor device has been reduced rapidly, forming patterns having a fine pitch may be difficult because of limitations with a photolithography process defining the patterns demanded for realizing the semiconductor devices.

SUMMARY

Some example embodiments of the inventive concepts may provide methods for forming fine patterns arranged in zigzag form.

According to an example embodiment of the inventive concepts, a method for forming fine patterns includes forming first hard mask patterns and second hard mask patterns extending in a first direction on a lower layer, the first and second hard mask patterns repeatedly and alternately arranged, forming third mask patterns extending in a second direction perpendicular to the first direction on the first and second hard mask patterns, etching the first hard mask patterns using the third mask patterns to form first openings, forming filling patterns filling the first openings and gap regions between the third mask patterns, forming spacers on both sidewalls of each of the filling patterns after removing the third mask patterns, and etching the second hard mask patterns using the filling patterns and the spacers to form second openings.

In an example embodiment, the second openings may be disposed in a diagonal direction from the first openings.

In an example embodiment, a space between the first openings arranged in the first direction may be greater than a space between the first openings arranged in the second direction.

In an example embodiment, distances between a center of the first opening and centers of the second openings adjacent to the first opening may be substantially equal to each other in a plan view.

In an example embodiment, widths of the first and second hard mask patterns may be substantially equal to each other.

In an example embodiment, a width of the third mask patterns may be two or more times greater than a width of the first hard mask pattern.

In an example embodiment, the method may further include extending the first and second openings through the lower layer to form holes arranged in zigzag form in the lower layer.

In an example embodiment, the method may further include filling each of the holes formed in the lower layer with a filling material, and removing the lower layer to form fine patterns arranged in zigzag form.

In an example embodiment, widths of the first and second hard mask patterns may be substantially equal to each other.

In an example embodiment, a width of the third mask patterns may be two or more times greater than a width of one of the first hard mask patterns.

In an example embodiment, the first hard mask patterns and second hard mask patterns are formed by repeatedly forming the first hard mask patterns on the lower layer, the first hard mask patterns having a first pitch, and forming the second hard mask patterns to fill gap regions between the first hard mask patterns.

In an example embodiment, first hard mask patterns may be repeatedly formed to have an etch selectivity with respect to the lower layer, and the second hard mask patterns may be formed to have an etch selectivity with respect to the lower layer.

In an example embodiment, the third mask patterns may be formed with a second pitch which is two or more times greater than the first pitch.

In an example embodiment, the first hard mask patterns and second hard mask patterns may be formed including materials different from each other.

Forming the spacers may include removing the third mask patterns to form trenches in the substrate after etching the first hard mask patterns, the trenches locally exposing top surfaces of the first and second hard mask patterns, forming a spacer layer conformally covering the substrate having the trenches, and anisotropically etching the spacer layer until the top surfaces of the first and second hard mask patterns are locally exposed.

In an example embodiment, a distance between the first opening and the second opening adjacent to each other may be controlled by a thickness of the spacer layer.

According to another example embodiment of the inventive concepts, a method for forming fine patterns includes forming a lower layer on a substrate, forming a buffer mask layer on a lower layer, forming first and second mask patterns on the buffer mask layer, etching the first and second mask patterns to form openings, etching the buffer mask layer using the first and second mask patterns to form a buffer mask pattern, etching the lower layer using the buffer mask pattern to form a lower pattern exposing the substrate, the lower pattern including holes arranged in a zigzag form on the substrate, and filling the holes in the lower pattern with a filling material before removing the lower pattern.

In another example embodiment, etching the first and second mask patterns may include forming third mask patterns on the first and second mask patterns, etching the first mask patterns using the third mask patterns to form first openings, forming filling patterns filling the first openings and gap regions between the third mask patterns, forming spacers on both sidewalls of each of the filling patterns after removing the third mask patterns, and etching the second mask patterns using the filling patterns and the spacers to form second openings.

In another example embodiment, the third mask patterns may be formed to have a width two or more times greater than a width of one of the first mask patterns.

In another example embodiment, the first and second mask patterns may be formed to have widths substantially equal to each other.

In another example embodiment, the first and second mask patterns may be formed including materials different from each other.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Figure 1:
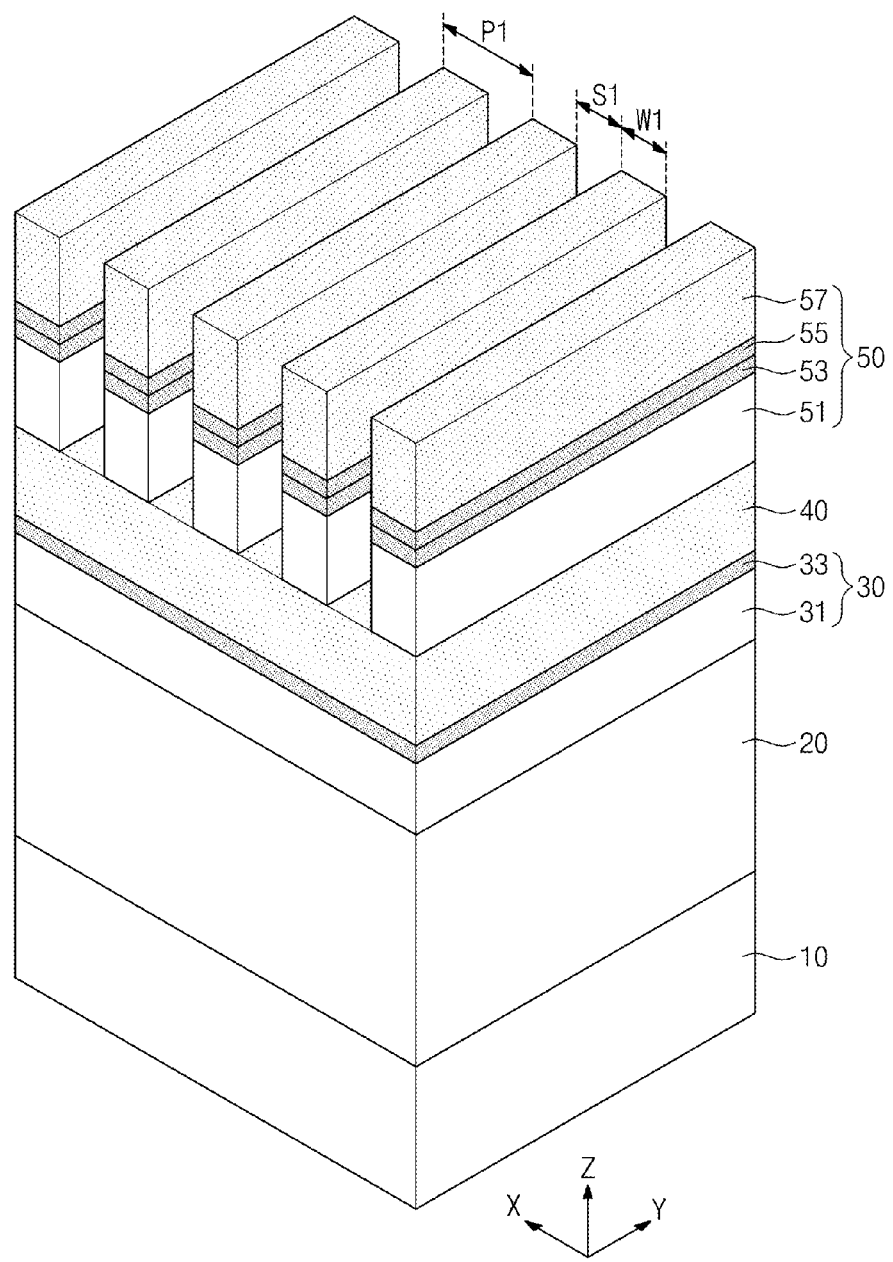
FIGS. 1 to 14 are perspective views illustrating a method for forming fine patterns according to an example embodiment of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiment in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas illustrated in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other embodiments without departing from the teachings of the inventive concepts. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, a method for forming fine patterns according to an example embodiment of the inventive concepts will be described with reference to FIGS. 1 to 14 and 15 in detail.

Fine patterns in a semiconductor device may be arranged in various forms. If the fine patterns are arranged in a square form, it may be limited that widths (e.g., diameters) of the fine patterns increase in a limited area. Alternatively, if the fine patterns are arranged in zigzag form or honeycomb form, a distance between the fine patterns may be greater than a distance between the fine patterns arranged in the square form. Thus, increasing the diameters of the fine patterns arranged in the honeycomb form may be possible as compared with the diameters of the fine patterns arranged in the square form.

A mask pattern including line and space patterns diagonally crossing each other may be used for forming the fine patterns arranged in the honeycomb form. However, if the line and space patterns diagonally cross each other, an etched region is defined as a diamond shape, such that etching properties may be deteriorated.

Some example embodiments of the inventive concepts disclose methods for forming fine patterns in the zigzag (or honeycomb) form by using line and space patterns perpendicularly crossing each other. Additionally, some example embodiments of the inventive concepts further disclose methods for preventing or inhibiting variation of the distances between the fine patterns arranged in the zigzag form and variation of the diameters of the fine patterns which are caused by undesirable distribution of overlay when the fine patterns are formed using the line and space patterns crossing each other perpendicularly.

Figure 14:
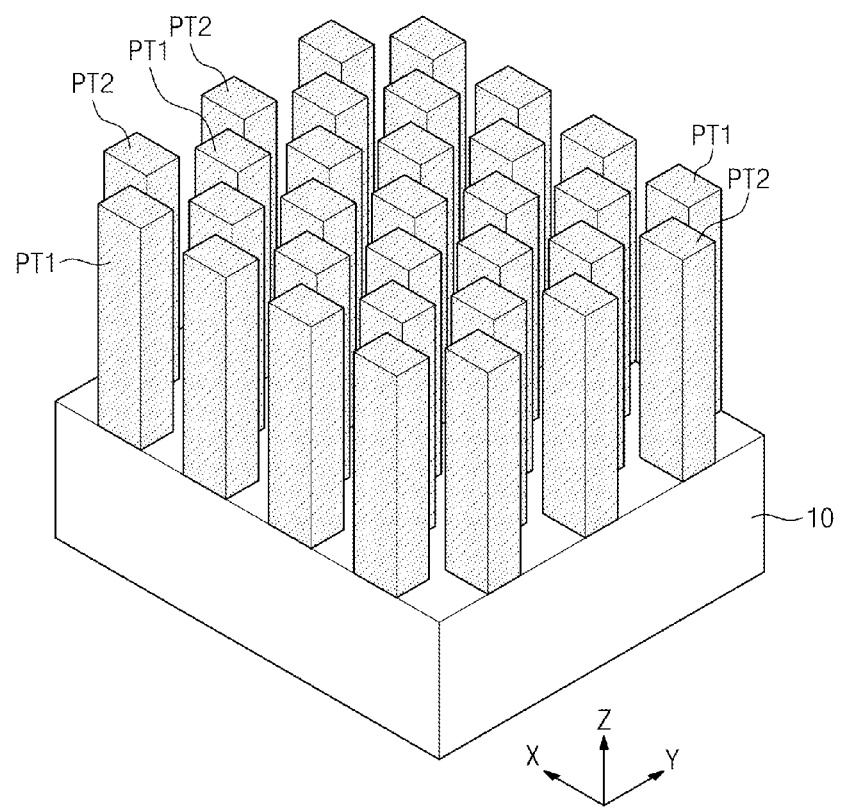
Figure 15:
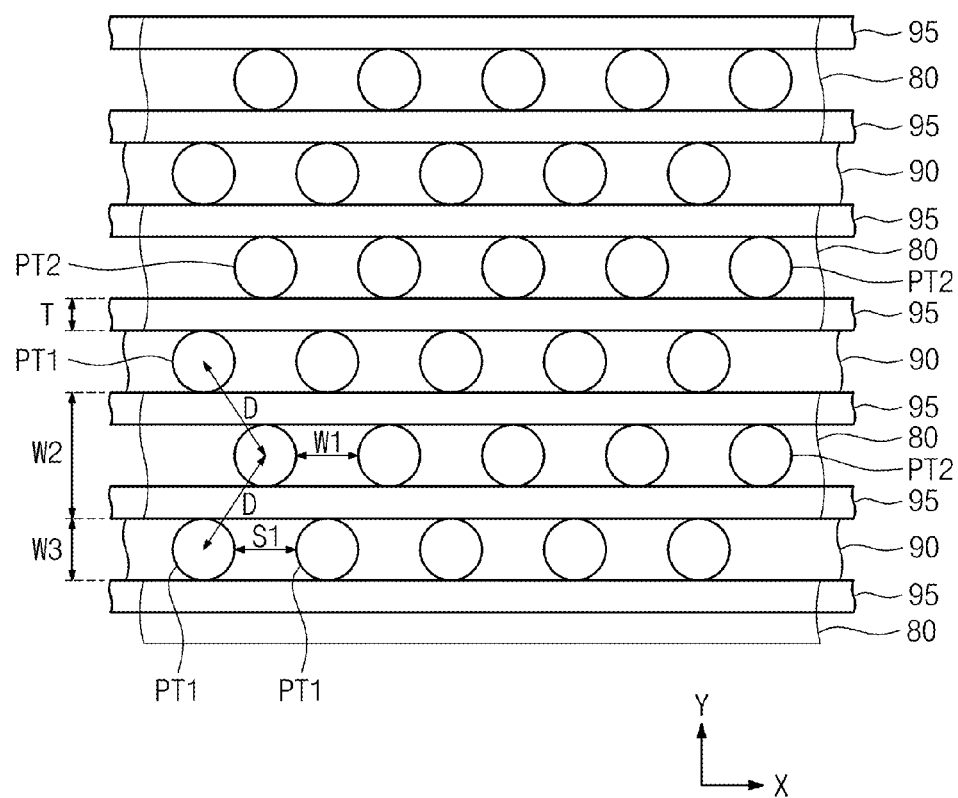
FIG. 15 is a plan view for explaining a method for forming fine patterns according to an example embodiment of the inventive concepts.

FIGS. 1 to 14 are perspective views illustrating a method for forming fine patterns according to an example embodiment of the inventive concepts. FIG. 15 is a plan view for explaining a method for forming fine patterns according to an example embodiment of the inventive concepts.

Referring to FIG. 1, a lower layer 20 and a first hard mask layer 40 may be sequentially stacked on a substrate 10. First mask patterns 50 may be formed on the first hard mask layer 40.

In some example embodiments, the lower layer 20 may be formed of one of a semiconductor material, a conductive material, an insulating material, and any combination thereof. For example, if the lower layer 20 is formed of the semiconductor material, the lower layer 20 may be a portion of the substrate 10 or an epitaxial layer. For example, if the lower layer 20 is formed of the conductive material, the lower layer 20 may be formed of one of poly-silicon doped with dopants, metal silicide, metal, metal nitride, and any combination thereof. If the lower layer 20 is formed of the insulating material, the lower layer 20 may be formed of one of silicon oxide, silicon nitride, silicon oxynitride, a low-k dielectric material having a low dielectric constant, and any combination thereof.

The lower layer 20 may be a single layer, or a stack layer including a plurality of layers sequentially stacked. For example, the lower layer 20 may include a plurality of insulating layers sequentially stacked. A conductive layer or a semiconductor layer may further be disposed between the stacked insulating layers. In some embodiments, the lower layer 20 may include at least one of a semiconductor pattern, a conductive pattern, and an insulating pattern.

The first hard mask layer 40 may be formed of a material having an etch selectivity with respect to an underlying layer. In some embodiments, the first hard mask layer 40 may be formed of a material having an etch selectivity with respect to a buffer capping layer 33. In other embodiments, if the first hard mask layer 40 is formed directly on the lower layer 20, the first hard mask layer 40 may be formed of a material having an etch selectivity with respect to the lower layer 20. For example, the first hard mask layer 40 may be formed of at least one selected from silicon-containing materials such as poly-silicon, SiON, $Si_3N_4$, SiCN, and SiC.

In some embodiments, a buffer mask layer 30 may further be disposed between the lower layer 20 and the first hard mask layer 40. In some embodiments, the buffer layer 30 may provide a flat surface on which the first mask patterns 50 are formed. Additionally, the buffer layer 30 may be used as an etch mask material for patterning the lower layer 20. The buffer layer 30 may be a single layer. Alternatively, the buffer layer 30 may include a plurality of thin layers sequentially stacked. In some embodiments, the buffer layer 30 may include a buffer organic layer 31 and the buffer capping layer 33 sequentially stacked.

In more detail, the buffer organic layer 31 may be formed using a spin-on-coating method. Thus, roughness of a top surface of the buffer organic layer 31 may be relatively small. Additionally, the buffer organic layer 31 may be formed of a material having an etch selectivity with respect to the lower layer 20. In detail, the buffer organic layer 31 may be formed of a material of which a main ingredient is carbon. For example, the buffer organic layer 31 may be formed of a layer consisting of carbon and hydrogen, or a layer consisting of carbon, hydrogen, and oxygen. A carbon content of the buffer organic layer 31 may be within a range of about 80 wt % to about 99 wt %. In some embodiments, the buffer organic layer 31 may be formed of APF (manufactured by Applied Materials, Inc.), SiLK™ (manufactured by Dow Chemical Company), NCP (manufactured by ASM), AHM (manufactured by Novellous Corp.), or a C-SOH layer.

The buffer capping layer 33 may be formed of a material having an etch selectivity with respect to the buffer organic layer 31. For example, an etch ratio of the lower layer 20 versus the buffer capping layer 33 may be about 10:1 or more. Thus, an etch rate of the lower layer 20 may be greater than an etch rate of the buffer capping layer 33 in a process etching the lower layer 20. As a result, preventing or inhibiting mask patterns from being damaged before the process etching the lower layer 20 is finished may be possible. In some embodiments, the buffer capping layer 33 may be formed of at least one selected from silicon-containing materials such as SiON, $SiO_2$, $Si_3N_4$, SiCN, SiC, and poly-silicon. A thickness of the buffer capping layer 33 may be changed according to a thickness of the first mask patterns 50 formed on the buffer capping layer 33.

In some embodiments, the first mask patterns 50 on the first hard mask layer 40 may be line and space patterns. The first mask patterns 50 may extend in a first direction (i.e., a y-axis direction). The first mask patterns 50 may be repeatedly arranged on the first hard mask layer 40 with a first pitch P1. At this time, the first pitch P1 of the first mask patterns 50 may be controlled to change diameters (or widths) of desired fine patterns. The first pitch P1 may be about two times greater than a width W1 of the first mask pattern 50. In other words, the width W1 of the first mask pattern W1 may be substantially the same as a space Si between the first mask patterns 50. Alternatively, the first mask patterns 50 may be repeatedly arranged with the first pitch P1 and the first width W1 of the first mask pattern 50 may be greater or less than the space Si between the first mask patterns 50.

In some embodiments, the first mask pattern 50 may include a first organic layer 51, a first capping pattern 53, a first anti-reflection pattern 55, and a first photoresist pattern 57 which are sequentially stacked. Forming the first mask patterns 50 may include sequentially stacking a first organic layer, a first capping layer, a first anti-reflection layer, and a first photoresist layer, performing a first photolithography process for forming line and space patterns to form the first photoresist patterns 57, and successively etching the first reflection layer, a first capping layer, and a first organic layer using the first photoresist patterns 57 as etch masks. The first organic pattern 51 may be formed of a material of which a main ingredient is carbon, and the first organic pattern 51 may be formed using a spin-on-coating method as the buffer organic layer 31. Like the buffer capping layer 33, the first capping pattern 53 may be formed of a material having desirable etch selectivity with respect to an etch target layer (i.e., the first hard mask layer 40). For example, the first capping pattern 54 may be formed of at least one selected from silicon-containing materials such as SiON, $SiO_2$, $Si_3N_4$, SiCN, SiC, and poly-silicon. The first anti-reflection pattern 55 may be formed of a material which absorbs light to prevent or inhibit light reflection during an exposure process. Additionally, the first anti-reflection pattern 55 may be formed of an organic material having an etching property similar to that of the first photoresist patterns 57.

Figure 2:
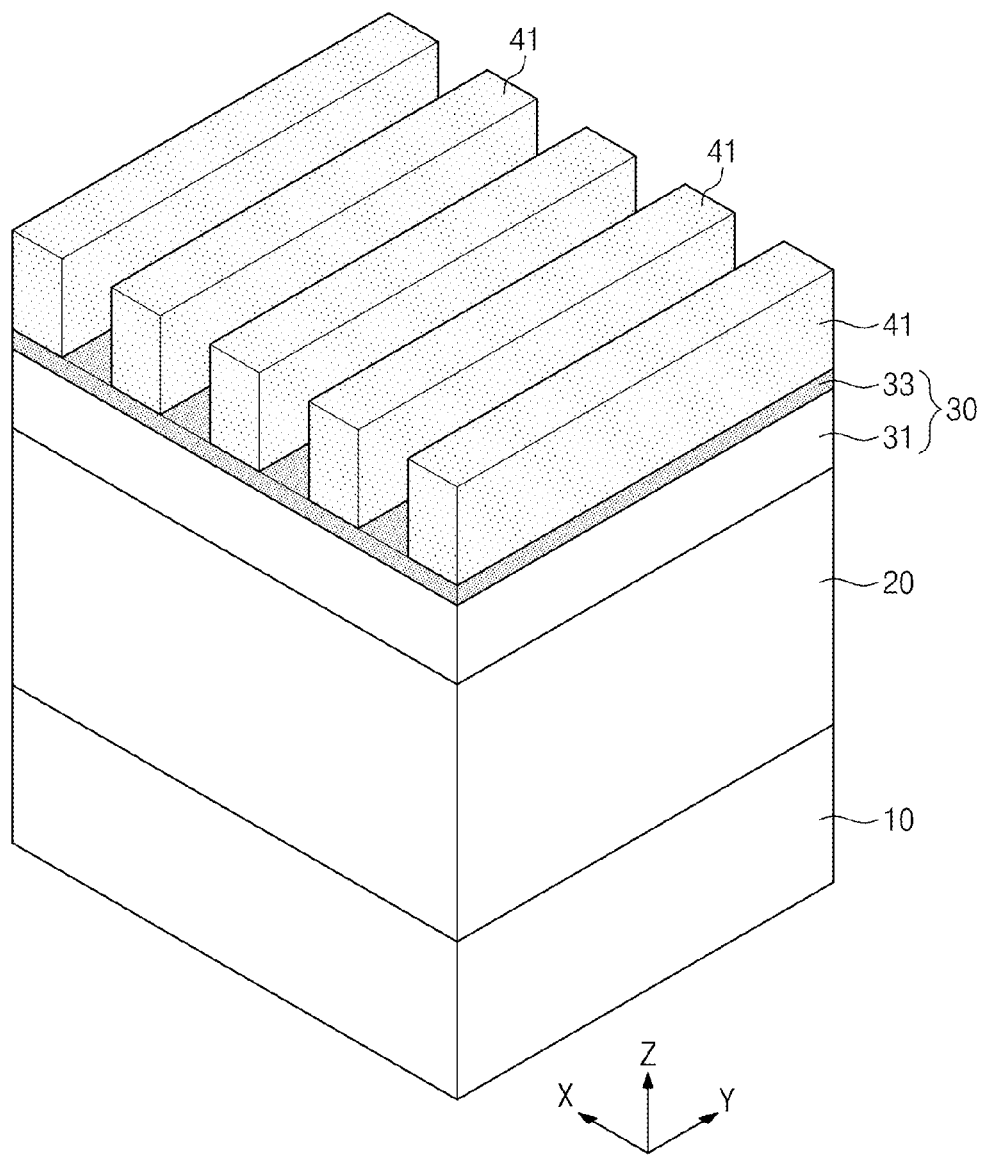

Referring to FIG. 2, the first hard mask layer 40 is anisotropically etched using the first mask patterns 50 as etch masks. Thus, first hard mask patterns 41 having line-shapes may be formed on the buffer mask layer 30. When the first hard mask layer 40 is anisotropically etched, the buffer mask layer 30 may be used as an etch stop layer.

In some embodiments, since the first hard mask patterns 41 are formed using the first mask patterns 50 as etch masks, the first hard mask patterns 41 may be repeatedly arranged with the first pitch P1. The first pitch P1 may be about two times greater than a width W1 of the first hard mask pattern 41. In the method for forming fine patterns according to some embodiments, the diameters of the fine patterns may be determined depending on the widths and spaces of the first hard mask patterns 41. After the first hard mask patterns 41 are formed, the first mask patterns 50 may be removed using an ashing process and a strip process.

Figure 3:
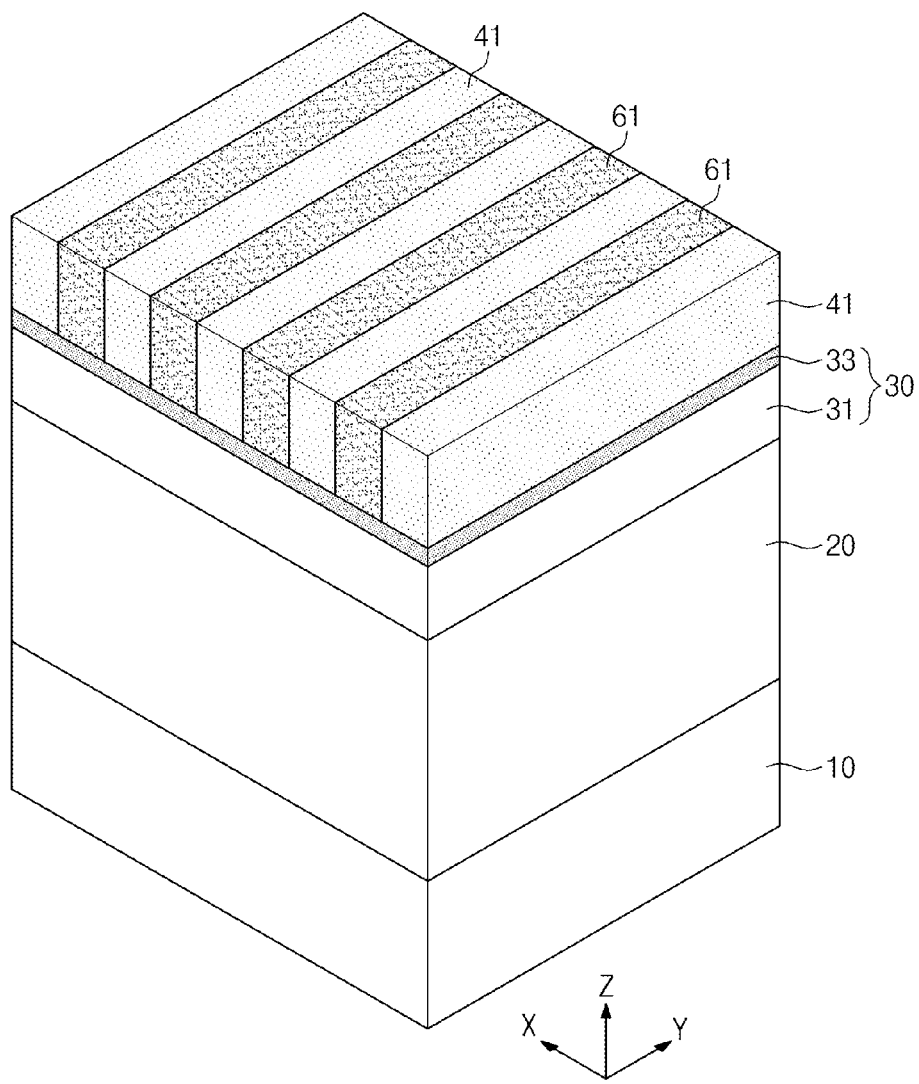

Referring to FIG. 3, second hard mask patterns 61 may be formed to fill gap regions between the first hard mask patterns 41, respectively. In some embodiments, forming the second hard mask patterns 61 may include depositing a second hard mask layer filling the gap regions between the first hard mask patterns 41, and planarizing the second hard mask layer until top surfaces of the first hard mask patterns 41 are exposed.

Since the second hard mask patterns 61 fill the gap regions between the first hard mask patterns 41, the second hard mask patterns 61 may also be repeatedly arranged with the first pitch P1. In some embodiments, a width of the second hard mask pattern 61 may be substantially the same as the width of the first hard mask pattern 41.

The second hard mask patterns 61 may be formed of a material having an etch selectivity with respect to the first buffer mask layer 30 and the first hard mask patterns 41. For example, the second hard mask patterns 61 may be formed of at least one selected from silicon-containing materials such as SiON, $SiO_2$, $Si_3N_4$, SiCN, SiC, and poly-silicon. The second hard mask patterns 61 are formed of a material different from that of first hard mask patterns 41.

Figure 4:
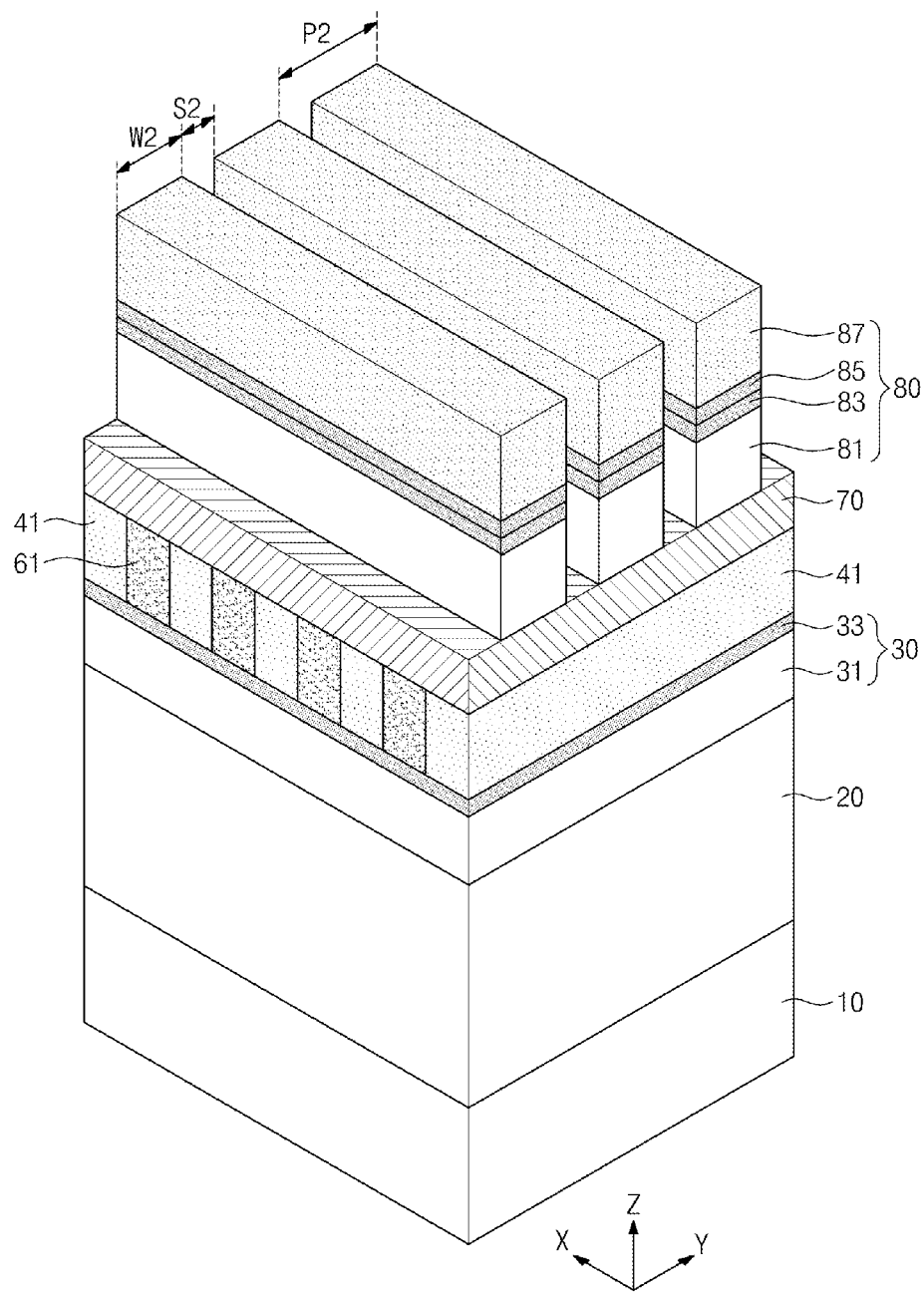

Referring to FIG. 4, a sacrificial layer 70 may be formed to cover top surfaces of the first and second hard mask patterns 41 and 61 and second mask patterns 80 may be formed on the sacrificial layer 70.

In some embodiments, the sacrificial layer 70 may be formed of a material having an etch selectivity with respect to the first and second hard mask patterns 41 and 61. For example, the sacrificial layer 70 may be formed at least one selected from silicon-containing materials such as SiON, $SiO_2$, $Si_3N_4$, SiCN, SiC, and poly-silicon and may be formed of a material different from those of the first and second hard mask patterns 41 and 61. The sacrificial layer 70 may be a single layer or include a plurality of thin layers sequentially stacked.

The second mask patterns 80 may be line and space patterns. The second mask patterns 80 may perpendicularly cross over the first and second hard mask patterns 41 and 61. In other words, the second mask patterns 80 may extend in a second direction (e.g., an x-axis direction) perpendicular to the first direction. Thus, the top surfaces of the first and second hard mask patterns 41 and 61 may be locally exposed by the second mask patterns 80.

According to some embodiments, the second mask patterns 80 may be repeatedly arranged with a second pitch P2. The second pitch P2 may be about two or more times greater than the first pitch P1 of the first hard mask patterns 41. The second pitch P2 may be controlled so that a space in the y-axis direction between first openings 65 (see FIG. 5) formed in a subsequent process may be controlled and the space between the fine patterns may be changed. Additionally, the diameter of the fine pattern may be changed depending on a space S2 between the second mask patterns 80.

In some embodiments, a width W2 of the second mask pattern 80 may be greater than the width W1 of the first hard mask pattern 41. For example, the width W2 of the second mask pattern 80 may be about two or more times greater than the width W1 of the first mask pattern 50 of FIG. 1. The space S2 between the second mask patterns 80 may be substantially equal to or greater than the space (e.g., S1 of FIG. 1) between the first hard mask patterns 41 (or the space between the second hard mask patterns 61).

In some embodiments, each of the second mask patterns 80 may include a second organic pattern 81, a second capping pattern 83, a second anti-reflection pattern 85, and a second photoresist pattern 87 which are sequentially stacked similarly to the first mask pattern 50.

In more detail, forming the second mask patterns 80 may include sequentially stacking a second organic layer, a second capping layer, a second anti-reflection layer, and a second photoresist layer, performing a second photolithography process for forming line and space patterns to form second photoresist patterns 87, and successively etching the second reflection layer, a second capping layer, and a second organic layer using the second photoresist patterns 87 as etch masks. The second organic layer may be formed of a material of which a main ingredient is carbon, and the second organic layer may be formed using a spin-on-coating method.

The second capping layer may be formed of a material having desirable etch selectivity with respect to an etch target layer (e.g., the sacrificial layer 70) and the first and second hard mask patterns 41 and 61. For example, the second capping layer may be formed of at least one selected from silicon-containing materials such as SiON, $SiO_2$, $Si_3N_4$, SiCN, SiC, and poly-silicon. The second anti-reflection layer may be formed of a material which absorbs light to prevent or inhibit light reflection during an exposure process. Additionally, the second anti-reflection layer may be formed of an organic material having an etching property similar to that of the second photoresist patterns 87.

Figure 5:
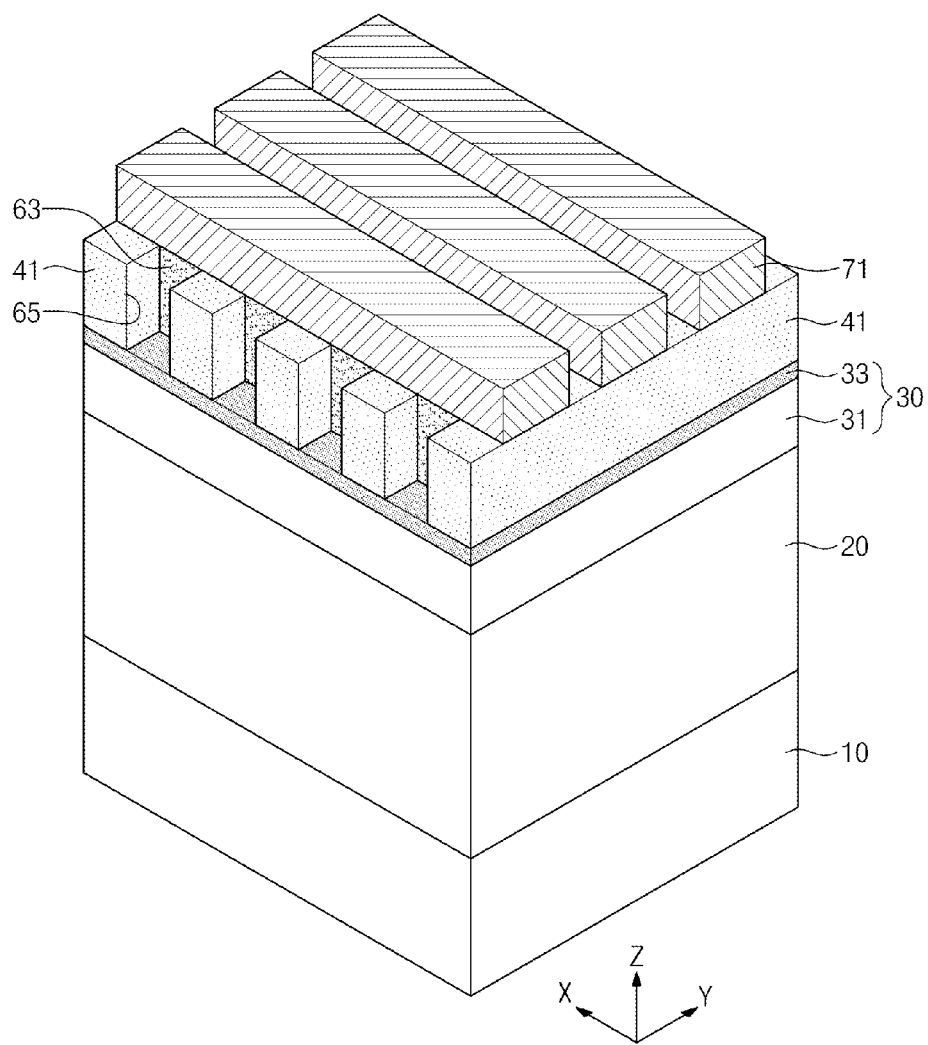

After the second mask patterns 80 are formed, the sacrificial layer 70 is anisotropically etched using the second mask patterns 80 as etch masks. Thus, sacrificial patterns 71 may be formed to cross the first and second hard mask patterns 41 and 61 as illustrated in FIG. 5. Since the sacrificial patterns 71 are formed using the second mask patterns 80 as etch masks, the sacrificial patterns 71 may be repeatedly arranged with the second pitch P2. Additionally, a width of the sacrificial pattern 71 and a space between the sacrificial patterns 71 may be substantially the same as the width of the second mask pattern 80 and the space between the second mask patterns 80, respectively.

Subsequently, the second hard mask patterns 61 may be selectively etched using the sacrificial patterns 71 as etch masks. Thus, first openings 65 locally exposing the buffer mask layer 30 may be formed in the second hard mask patterns 61. In other words, second hard mask patterns 63 having the first openings 65 may be formed between the first hard mask patterns 41.

Since the first hard mask patterns 41 are formed of a material different from that of the second hard mask patterns 61 when the first openings 65 are formed, the first hard mask patterns 41 may be used as etch masks in company with the sacrificial patterns 71. Thus, the first openings 65 may partially expose sidewalls of the first hard mask patterns 41.

In some embodiments, the first openings 65 may be two-dimensionally arranged in the first direction (i.e., the y-axis direction) and the second direction (i.e., the x-axis direction). The first openings 65 arranged along the first direction may be disposed at equal intervals, and the first openings 65 arranged along the second direction may be disposed at equal intervals. A space between the first openings 65 arranged in the first direction may be greater than a space between the first openings 65 arranged in the second direction. The space between the first openings 65 in the first direction may be defined by the width of the second mask pattern 80.

On the other hand, during the formation of the sacrificial patterns 71 and the first openings 65, top surfaces of the second mask patterns 80 may be recessed so that the second mask patterns 80 may be removed. Alternatively, after the sacrificial patterns 71 and the first openings 65 are formed, the second mask patterns 80 may be removed by an ashing process and a strip process.

Figure 6:
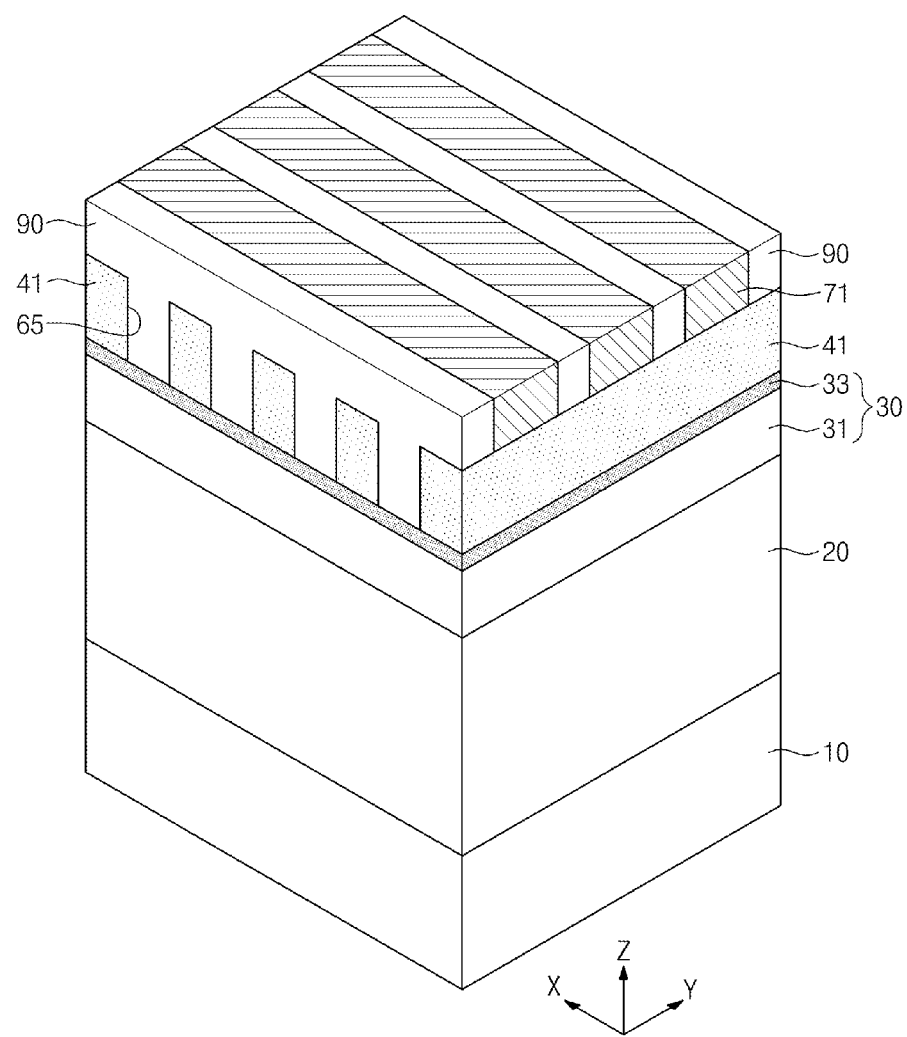

Referring to FIG. 6, filling patterns 90 are formed to fill the first openings 65 and gap regions between the sacrificial patterns 71. The filling patterns 90 may be formed in line and space form in a plan view.

In some embodiments, forming the filling patterns 90 may include forming a filling layer filling the first openings 65 and gap regions between the sacrificial patterns 71, and planarizing the filling layer until top surfaces of the sacrificial patterns 71 are exposed. The filling layer may be formed by a deposition method or a spin-on-coating method. Due to the deposition method or the spin-on-coating method, the filling layer may fill the first openings 65 and gap regions between the sacrificial patterns 71 and have a flat top surface. In some embodiments, when the first openings 65 are formed, upper sidewalls of the sacrificial patterns 71 may be inclined. Thus, for preventing or inhibiting an upper width and a lower width of the filling pattern 90 filling the gap region between the sacrificial patterns 71 from being different from each other, the planarization process may be controlled in order that an upper width of the filling pattern 90 is substantially equal to a lower width of the filling pattern 90.

According to some embodiments, the filling patterns 90 may be formed of a material having an etch selectivity with respect to the sacrificial patterns 71 and the first and second hard mask patterns 41 and 61. For example, the filling patterns 90 may be formed of a material of which a main ingredient is carbon.

Figure 7:
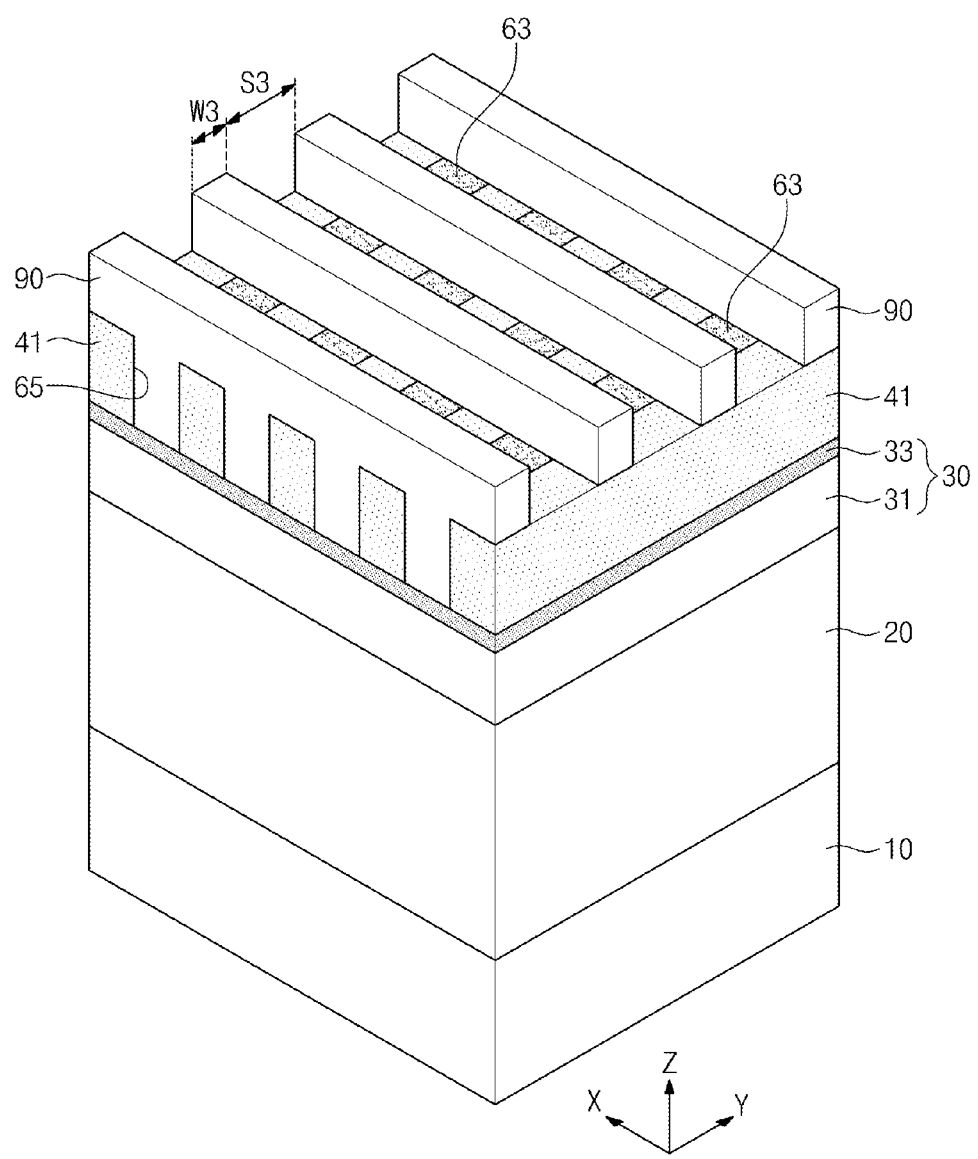

After the filling patterns 90 are formed, the sacrificial patterns 71 are removed. Thus, as illustrated in FIG. 7, trenches may be formed to locally expose the top surfaces of the first and second hard mask patterns 41 and 63. A width S3 of each of the trenches may be substantially equal to the width W2 of the sacrificial pattern 71 and be about two or more times greater than a width W3 of the filling pattern 90.

Figure 8:
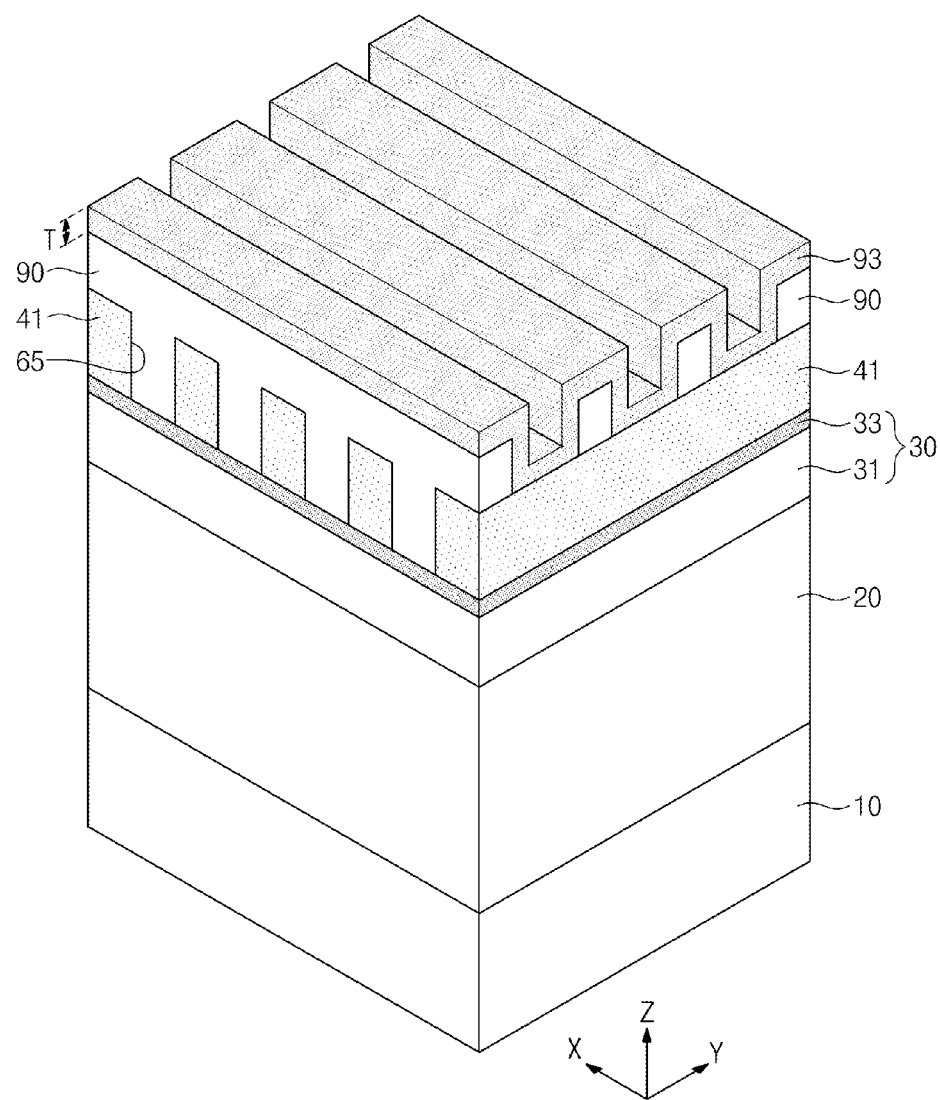

Referring to FIG. 8, a spacer layer 93 may be formed to conformally cover inner sidewalls of the trenches defined by the filling patterns 90. In detail, the spacer layer 93 may be formed of a material having an etch selectivity with respect to the first and second hard mask patterns 41 and 63 and the filling patterns 90. In other words, the spacer layer 93 may be formed of a material different from those of the first and second hard mask patterns 41 and 63 and the filling patterns 90. For example, the spacer layer 93 may be formed of at least one of SiON, $SiO_2$, $Si_3N_4$, SiCN, SiC, and poly-silicon.

The spacer layer 93 may cover top surfaces and both sidewalls of the filling patterns 90 and the top surfaces of the first and second hard mask patterns 41 and 63 exposed by the trenches with uniform thickness. The spacer layer 93 may be formed using at least one of a physical vapor deposition (PVD) technique, a thermal chemical vapor deposition (thermal CVD) technique, a low pressure-CVD (LP-CVD) technique, and an atomic layer deposition (ALD).

According to some embodiments, when the spacer layer 93 is deposited, a deposition thickness T of the spacer layer 93 may control diameters of second openings formed in a subsequent process and a space between fine patterns adjacent to each other. For example, the deposition thickness T of the spacer layer 93 may be less than a half of the width S3 of the trench (e.g., T<S3/2). In some embodiments, the deposition thickness T of the spacer layer 93 may be less than the width W3 of the filling pattern 90 (e.g., T<W3) and be greater than a half of the width W3 of the filling pattern 90 (e.g., T>W3/2). Alternatively, a deposition thickness T of the spacer layer 93 may be less than the half of the width W3 of the filling pattern 90 (e.g., T<W3/2).

Figure 9:
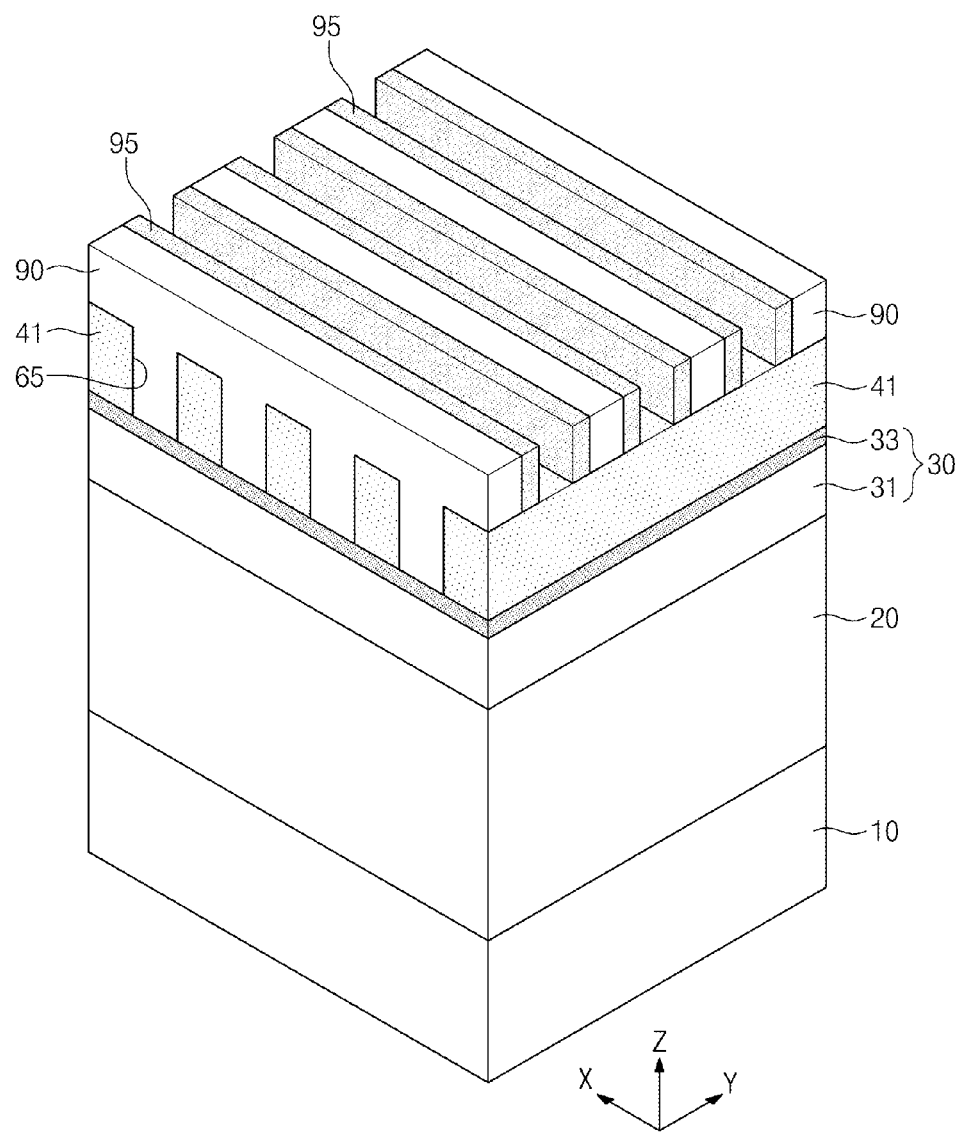

Referring to FIG. 9, the spacer layer 93 is anisotropically etched to form spacers 95 on both sidewalls of each of the sacrificial patterns 90, respectively. The spacers 95 may have line-shapes extending in the second direction. The spacers 95 may locally expose the top surfaces of the first and second hard mask patterns 41 and 63. A width of a trench defined by the spacers 95 may be substantially equal to the width of each of the first and second hard mask patterns 41 and 63. In other words, the width of the trench may be defined by the spacers 95 may be substantially equal to the diameter of the first opening 65.

Figure 10:
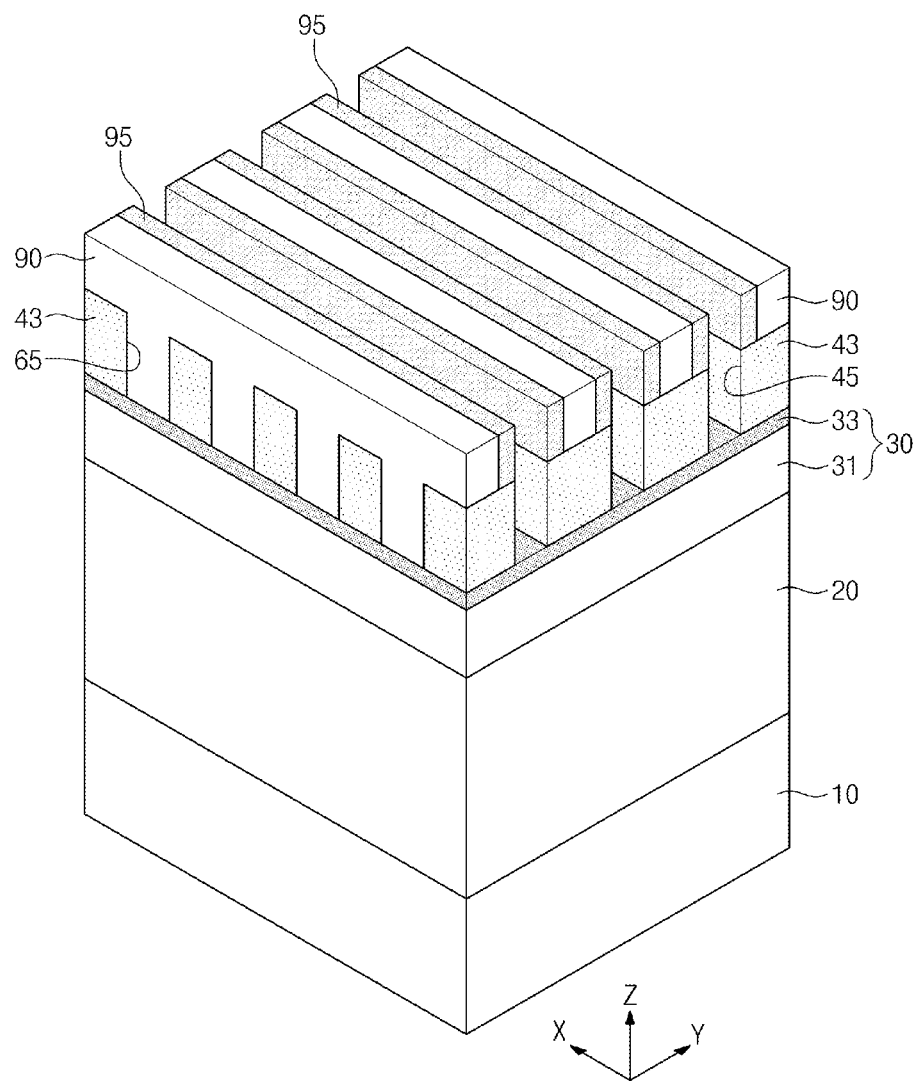

Referring to FIG. 10, the first hard mask patterns 41 are selectively etched using the filling patterns 90 and the spacers 95 as etch masks. Thus, second openings 45 may be formed in the first hard mask patterns 41. In FIG. 10, a reference numeral "43" means the first hard mask pattern having the second openings 45. When the second openings 45 are formed, since the first hard mask patterns 43 are formed of a material different from the second hard mask patterns 63, the second hard mask patterns 63 may be used as etch masks in company with the filling patterns 90 and the spacers 95.

Figure 11:
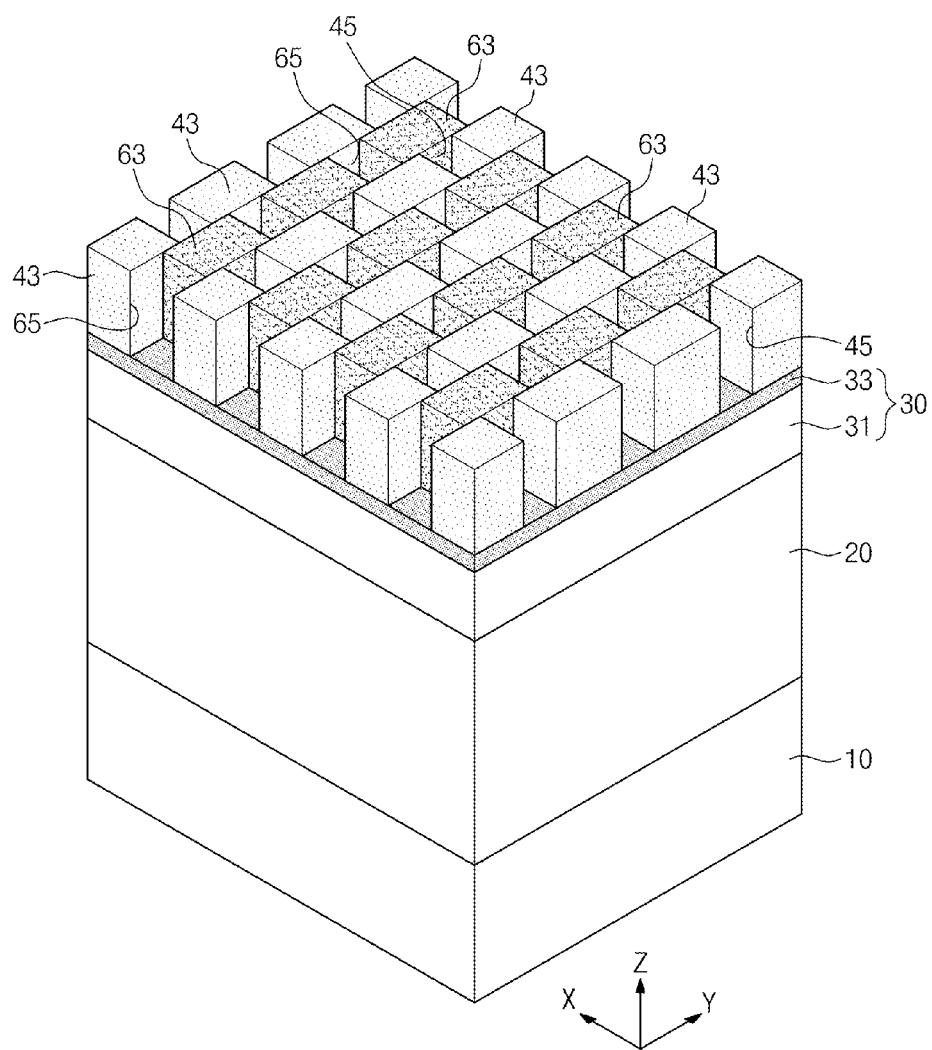

After the second openings 45 are formed, the spacers 95 and the filling patterns 90 may be sequentially removed. Thus, the first and second hard mask patterns 43 and 63 having the first and second openings 65 and 45 may be formed on the buffer mask layer 30 as illustrated in FIG. 11.

In detail, the second openings 45 may be two-dimensionally arranged in the first direction and the second direction. The second openings 45 arranged in the first direction may be disposed at equal intervals. The second openings 45 arranged in the second direction may also be disposed at equal intervals. The second openings 45 may be disposed in a diagonal direction from the first openings 65. In other words, the first and second openings 65 and 45 may be arranged in zigzag form on the buffer mask layer 30. In some embodiments, a space between the second openings 45 arranged in the first direction may be greater than a space between the second openings 45 arranged in the second direction. The space between the second openings 45 arranged in the first direction may be defined by a sum of the width of filling pattern 90 and widths of the spacers 95 respectively disposed on both sidewalls of the filling pattern 90 as described with reference to FIG. 9.

In some embodiments, a distance between centers of the first opening 65 and the second opening 45 adjacent to each other may be constant. In other words, the distances between the center of the first opening 65 and the centers of the second openings 45 adjacent to the first opening 65 may be substantially equal to each other. Likewise, the distances between the center of the second opening 45 and the centers of the first openings 65 adjacent to the second opening 45 may be substantially equal to each other.

Figure 12:
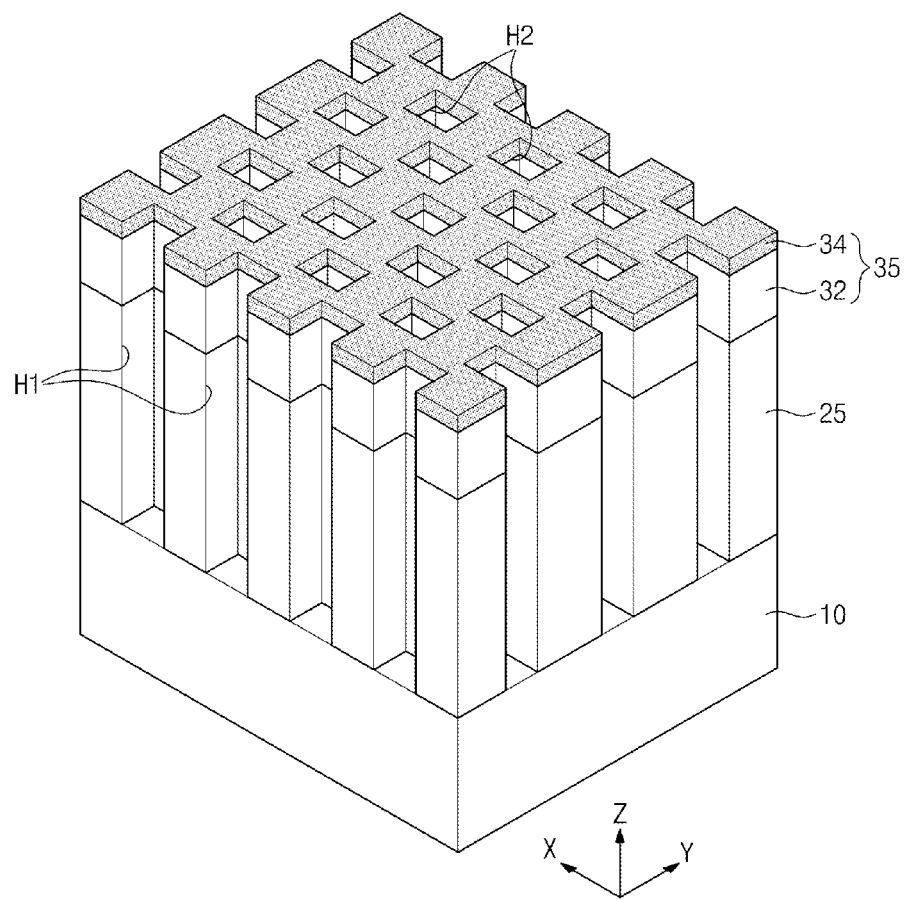

Subsequently, the buffer mask layer 30 is etched using the first and second hard mask patterns 43 and 45 defining the first and second openings 65 and 45 as etch masks. Thus, the first and second openings 65 and 45 may pass through the buffer mask layer 30, so that buffer mask pattern 35 may be formed as illustrated in FIG. 12. The buffer mask pattern 35 may include a buffer organic pattern 32 and a buffer capping pattern 34 sequentially stacked. The buffer organic pattern 32 and the buffer capping pattern 34 may have first and second holes H1 arranged in zigzag form. Each of the first and second holes H1 and H2 may successively penetrate the buffer capping pattern 34 and the buffer organic pattern 32.

The lower layer 20 may be continuously etched using the buffer mask pattern 35 as an etch mask to form a lower pattern 25. After the lower pattern 25 is formed, the buffer mask pattern 35 may be removed. The lower pattern 25 may have first and second holes H1 and H2 in which the first and second openings 65 and 45 defined by the first and second hard mask patterns 43 and 63 pass through. The first and second holes H1 and H2 formed in the lower pattern 25 may expose the substrate 10.

Figure 13:
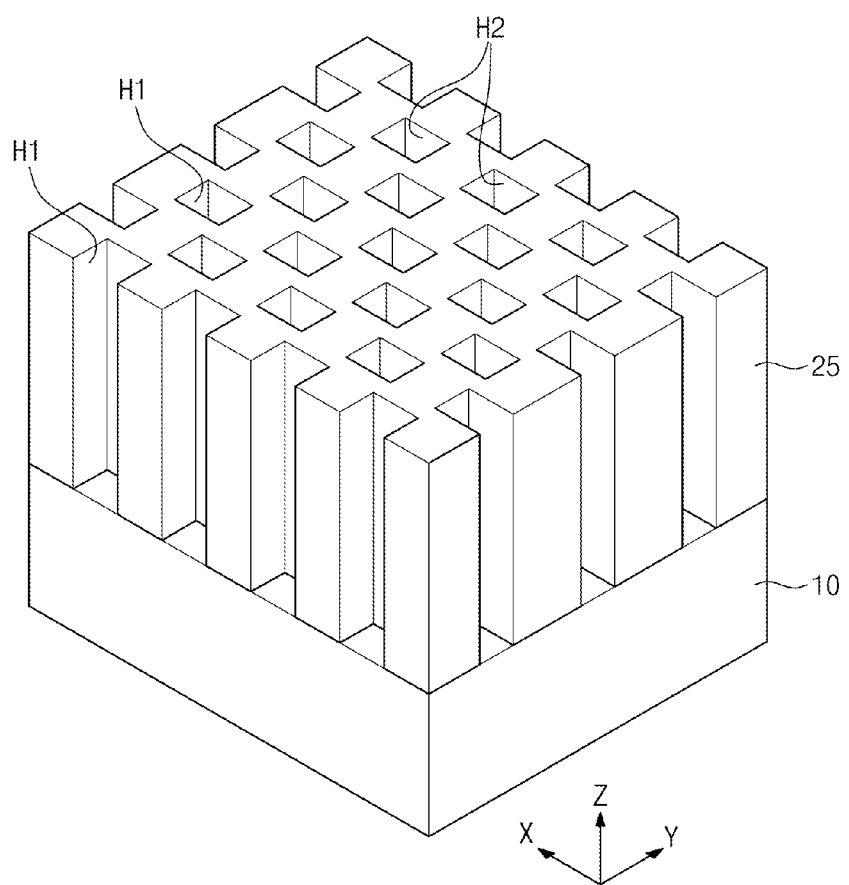

In other words, the lower pattern 25 may be formed to have the first and second holes H1 and H2 arranged in zigzag form as illustrated in FIG. 13. In more detail, the first holes H1 and the second holes H2 may be two-dimensionally arranged in the first direction and the second direction and the second holes H1 may be disposed in a diagonal direction with respect to the first and second directions from the first holes H2. A space between the first holes H1 arranged in the first direction may be greater than a space between the first holes H1 arranged in the second direction. Likewise, a space between the second holes H2 arranged in the first direction may be greater than a space between the second holes H2 arranged in the second direction. Additionally, distances between the first hole H1 and the second holes H2 adjacent thereto may be substantially equal to each other in a plan view. Likewise, distances between the second hole H2 and the first holes H1 adjacent thereto may be substantially equal to each other in a plan view.

A material layer (not shown) may be formed on the lower pattern 25 to fill the first and second holes H1 and H2. The material layer may be formed of a material having an etch selectivity with respect to the lower pattern 25. For example, the material layer may be formed of a conductive material, a semiconductor material, or an insulating material. The material layer may be planarized until the lower pattern 25 is exposed, so that fine patterns PT1 and PT2 may be formed in the first and second holes H1 and H2, respectively, as shown in FIG. 14.

The lower pattern 25 is removed. Thus, the fine patterns PT1 and PT2 arranged in zigzag form may be formed on the substrate 10. In more detail, the fine patterns PT1 and PT2 may include first fine patterns PT1 respectively formed in the first holes H1 and second fine patterns PT2 respectively formed in the second holes H2.

Like the arrangement of the first and second holes H1 and H2, the first and second fine patterns PT1 and PT2 may also be arranged in zigzag form. In detail, the first and second fine patterns PT1 and PT2 may be two-dimensionally arranged in the first direction (i.e., the y-axis direction) and the second direction (i.e., the x-axis direction) perpendicular thereto. A space between the first fine patterns PT1 arranged in the first direction may be greater than a space between the first fine patterns PT1 arranged in the second direction. Additionally, a space between the second fine patterns PT2 arranged in the first direction may also be greater than a space between the second fine patterns PT2 arranged in the second direction. The second fine patterns PT2 are disposed in a diagonal direction from the first fine patterns PT1. Distances between a center of the first fine pattern PT1 and centers of the second fine patterns PT2 adjacent thereto may be substantially equal to each other in a plan view Likewise, distances between a center of the second fine pattern PT1 and the centers of the first patterns PT2 thereto may be substantially equal to each other.

Hereinafter, the method for forming the fine patterns according to some embodiments will be briefly described with reference to FIG. 15.

Referring to FIG. 15, the first fine patterns PT1 (e.g., first openings 65 of FIG. 5) arranged in the second direction at uniform intervals may be formed by the second mask patterns 80. The distance between the first fine patterns PT1 in the first direction may be substantially equal to the width W2 of the second mask pattern 80 and be about two or more greater than the diameter of the first fine pattern PT1. Additionally, the space S1 between the first fine patterns PT1 in the second direction may be changed depending on the first pitch of the first mask patterns 50 of FIG. 1 as described with reference to FIG. 1.

Additionally, the second fine patterns PT2 (e.g., the second openings 45 of FIG. 10) may be formed to be arranged at uniform intervals in the second direction and to be disposed in a diagonal direction from the first fine patterns PT1 by the filling patterns 90 filling the gap regions between the mask patterns 80 and the spacers 95. In other words, the space between the second fine patterns PT2 in the first direction may be substantially equal to a sum of the width W3 of the filling pattern 90 and double the thickness T of the spacer 95. The space between the second fine patterns PT2 in the second direction may be changed depending on the first pitch of the first mask patterns 50 of FIG. 1, as described with reference to FIG. 1.

In some embodiments, the space S1 between the first fine patterns PT1 in the second direction may be substantially equal to the space W1 between the second fine patterns PT2 in the second direction. The distances D between the center of the first fine pattern PT1 and the centers of the second fine patterns PT2 adjacent to the first fine pattern PT1 may be substantially equal to each other in a plan view. Likewise, the distances D between the center of the second fine pattern PT2 and the centers of the first fine patterns PT2 adjacent to the second fine pattern PT2 may be substantially equal to each other in a plan view.

According to some example embodiments of the inventive concepts described above, a distance between the first fine pattern PT1 and the second fine pattern PT2 adjacent to each other in the first direction may be controlled by the thickness T of the spacer 95.

A method for manufacturing a semiconductor device using the formation method of the fine patterns according to example embodiments will be described hereinafter. The semiconductor device may include at least one of highly integrated semiconductor memory devices (e.g., a dynamic random access memory (DRAM), a static random access memory (SRAM), a phase change random access memory (PRAM), a resistance random access memory (RRAM), a ferroelectric random access memory (FRAM), and a flash memory), micro electro mechanical system (MEMS) devices, optoelectronic devices, and processors (e.g., a central processing unit (CPU) and a digital signal processor (DSP)). The semiconductor device may consist of the same kind of devices. Alternatively, the semiconductor device may be a single-chip data processing device which consists of different kinds of devices necessary to perform one complete function.

Figure 16:
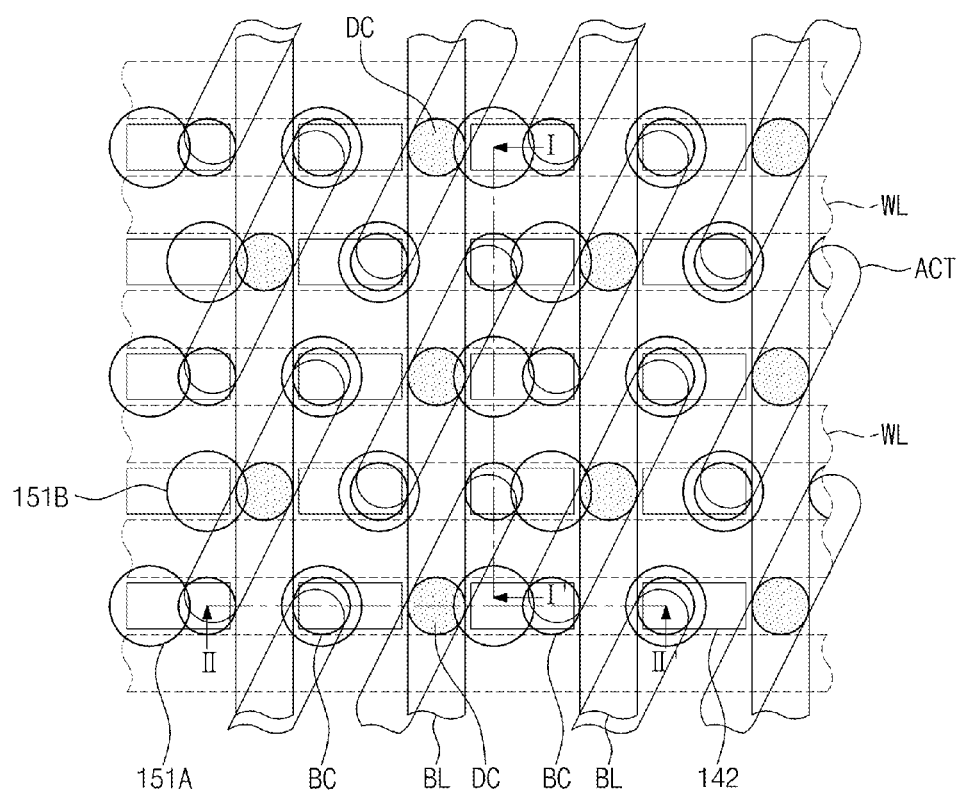
FIG. 16 is a plan view illustrating a semiconductor memory device formed using a method for forming fine patterns according to an example embodiment of the inventive concepts.
Figure 17:
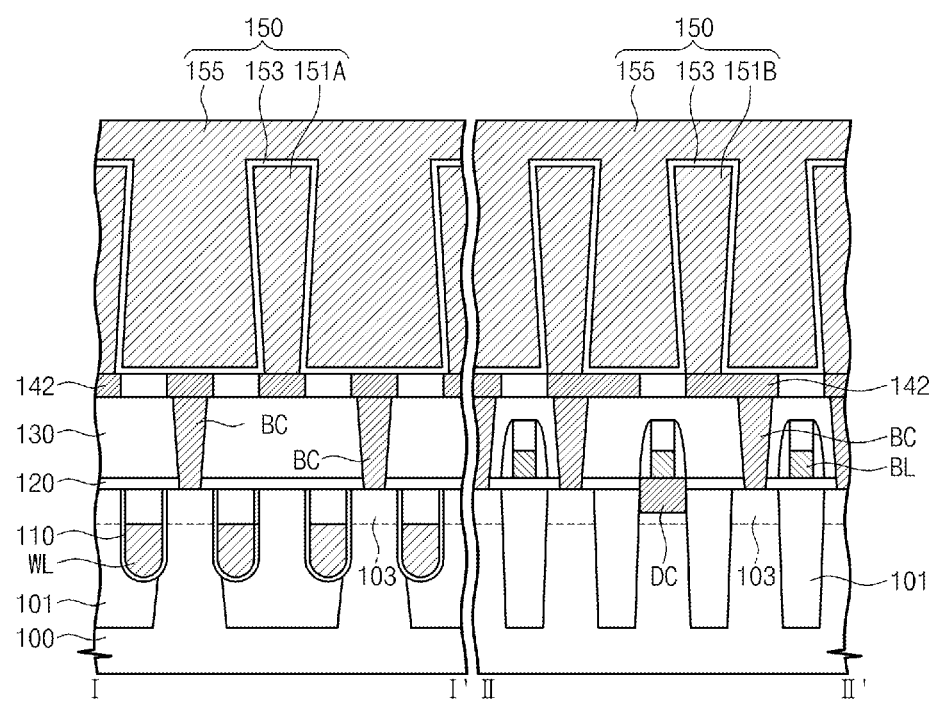
FIG. 17 is a cross-sectional view taken along lines I-I' and II-II' of FIG. 16.

Hereinafter, a semiconductor memory device which is formed using the method for the fine patterns according to an example embodiment of the inventive concepts will be described with reference to FIGS. 16 and 17. FIG. 16 is a plan view illustrating a semiconductor memory device formed using a method for forming fine patterns according to an example embodiment of the inventive concepts. FIG. 17 is a cross-sectional view taken along lines I-I' and II-II' of FIG. 16.

Referring to FIGS. 16 and 17, a semiconductor memory device may include word lines WL and bit lines BL crossing each other. The semiconductor memory device may further include memory cells respectively disposed at crossing regions of the word lines WL and the bit lines BL. In some embodiments, each of the memory cells may include a capacitor 150 including a lower electrode 151A or 151B, an upper electrode 155, and a dielectric layer 153 between the lower electrode 151A or 151B and the upper electrode 155.

In more detail, a device isolation layer 101 may be formed in the semiconductor substrate 100 to define active regions ACT. Each of the active regions ACT may have a bar-shape, and a long axis of each of the active regions ACT may be disposed in a diagonal direction with respect to the word lines WL and the bit lines BL.

The word lines WL may cross the active regions ACT. In some embodiments, the word lines WL may be respectively formed in recess regions which are recessed from a top surface of the semiconductor substrate 100 by a given (or, alternatively predetermined) depth. A gate insulating layer 110 may be disposed between each of the word lines WL and an inner surface of each of the recess regions. Top surfaces of the word lines WL may be disposed at a level lower than the top surface of the semiconductor substrate 100, and an insulating material may fill the recess region on the top surface of the word line WL.

Source/drain regions 103 may be formed in the active regions ACT at both sides of each of the word lines WL. The source/drain regions 103 may be dopant regions doped with dopants. Since the word lines WL and the source/drain regions 103 are formed as described above, a plurality of MOS transistors may be formed on semiconductor substrate 100.

The bit lines BL may be disposed on the semiconductor substrate 100 to cross over the word lines WL. An interlayer insulating layer 120 may be disposed between the bit lines BL and the semiconductor substrate 100, and bit line contact plugs DC may be formed in the interlayer insulating layer 120. The bit line contact plugs DC may electrically connect the source/drain regions 103 to the bit lines BL.

Contact plugs BC electrically connecting data storing elements to the source/drain regions 103 may be formed in an upper interlayer insulating layer 130 covering the bit lines BL. In some embodiments, the contact plugs BC may be disposed on the active region ACT at both sides of the bit line BL.

Contact holes exposing the source/drain regions 103 may be formed in the upper interlayer insulating layer 130, a conductive layer filling the contact holes may be deposited on the upper interlayer insulating layer 130, and the conductive layer may be planarized to form the contact plugs BC. The contact plugs BC may be formed of at least one of polysilicon doped with dopants, metal, metal nitride, metal silicide, and any combination thereof.

In some embodiments, contact pads 142 may be formed on the contact plugs BC, respectively. The contact pads 142 may be two-dimensionally arranged on the upper interlayer insulating layer 130. The contact pad 142 may increase a contacting area between the lower electrode 151A or 151B on the contact pad 142 and the contact plug BC under the contact pad 142. In more detail, two neighboring contact plugs 142 disposed at both sides of the bit line BL in a plan view may be enlarged in opposite directions, respectively.

The lower electrode 151A or 151B of the capacitor 150 may be formed on each of the contact pads 142. In some embodiments, the lower electrodes 151A and 151B may be formed by the method for forming the fine patterns which is described with reference to FIGS. 1 to 15. In more detail, the lower pattern 25 including the first and second holes H1 and H2 described with reference to FIG. 13 may be formed on the contact pads 142, a conductive material may fill each of the first and second holes H1 and H2 arranged in zigzag form, and the lower pattern 25 of FIG. 13 may be removed to form the lower electrodes 151A and 151B. In other words, the lower electrodes 151A and 151B arranged in zigzag form may be formed on the upper interlayer insulating layer 130. In still other words, the lower electrodes 151A and 151B may be disposed in a diagonal direction with respect to the word lines WL and the bit lines BL.

After the lower electrodes 151A and 151B are formed, the dielectric layer 153 may be formed to conformally cover surfaces of the lower electrodes 151A and 151B. The upper electrode 155 may be formed on the dielectric layer 153.

Figure 18:
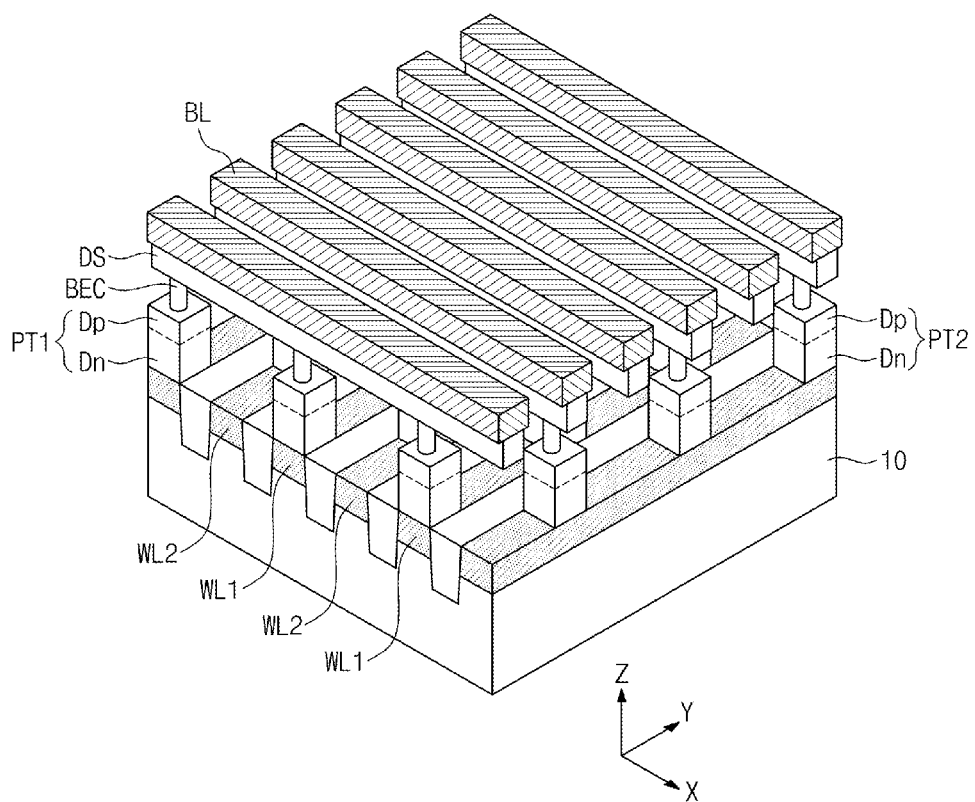
FIG. 18 is a cross-sectional view illustrating a variable resistance memory device formed using a method for forming fine patterns according to an example embodiment of the inventive concepts.

FIG. 18 is a cross-sectional view illustrating a variable resistance memory device formed using a method for forming fine patterns according to an example embodiment of the inventive concepts.

Referring to FIG. 18, a semiconductor memory device may include a semiconductor substrate 10, lower interconnections WL1 and WL2 on the semiconductor substrate 10, upper interconnections BL crossing over the lower interconnections WL1 and WL2, selection elements respectively disposed at crossing regions of the lower interconnections WL1 and WL2 and the upper interconnections BL, and a memory element DS disposed between the selection element and the upper interconnection BL in each of the crossing regions. The selection elements may be two-dimensionally arranged on the semiconductor substrate 10.

The selection element may control a flow of a current passing through the memory element DS.

In more detail, the lower interconnections WL1 and WL2 may have line-shapes extending in a y-axis direction on the semiconductor substrate 10. In some embodiments, the lower interconnections WL1 and WL2 may be highly doped regions which are formed by injecting dopants into the semiconductor substrate 10. The lower interconnections WL1 and WL2 may have a conductivity type different from that of the semiconductor substrate 10.

In the present embodiment, the selection elements may include semiconductor patterns PT1 and PT2 which are formed by the method for forming the fine patterns described with reference to FIGS. 1 to 15. In other words, a semiconductor material may fill each of the first and second holes H1 and H2 of the lower pattern 25 of FIG. 13 and the lower pattern 25 of FIG. 13 may be removed to form the semiconductor patterns PT1 and PT2. Thus, the semiconductor patterns PT1 and PT2 may be arranged in zigzag form.

In more detail, the selection elements may include first semiconductor patterns PT1 disposed on odd-numbered lower interconnections WL1 and second semiconductor patterns PT2 disposed on even-numbered lower interconnections WL2. In other words, a pitch of the first semiconductor patterns PT1 or a pitch of the second semiconductor patterns PT1 in a first direction (e.g., an x-axis direction) may be about two or more times greater than a pitch of the lower interconnections WL1 and WL2. The second semiconductor patterns PT2 may be disposed on the even-numbered lower interconnections WL2 and be disposed in a diagonal direction from the first semiconductor patterns PT1.

Additionally, each of the first and second semiconductor patterns PT1 and PT2 may include an upper dopant region Dp and a lower dopant region Dn. The upper dopant region Dp and the lower dopant region Dn may have conductivity types different from each other, respectively. For example, the lower dopant region Dn may have the same conductivity type as the lower interconnections WL1 and WL2, and the upper dopant region Dp may have a conductivity type opposite to that of the lower dopant region Dn. Thus, A PN junction may be formed in each of the first and second semiconductor patterns PT1 and PT2. Alternatively, an intrinsic region may be disposed between the upper dopant region Dp and the lower dopant region Dn, such that a PIN junction may be formed in each of the first and second semiconductor patterns PT1 and PT2. On the other hand, a bipolar transistor of a PNP structure or a NPN structure may be realized by the semiconductor substrate 10, the lower interconnection WL1 or WL2, and each of the first and second semiconductor patterns PT1 and PT2.

Lower electrodes BEC, the memory elements DS, and the upper interconnections BL may be disposed on the first and second semiconductor patterns PT1 and PT2. The upper interconnections BL may cross over the lower interconnections WL1 and WL2 and be disposed on the memory elements DS so as to be electrically connected to the memory elements DS.

In some embodiments, each of the memory elements DS may be formed to be substantially parallel to the upper interconnection BL and be electrically connected to a plurality of lower electrodes BEC. Alternatively, the memory elements DS may be two-dimensionally arranged. In other words, each of the memory elements DS may be disposed on each of the first and second semiconductor patterns PT1 and PT2 in one-to-one correspondence. The memory element DS may include a variable resistance pattern configured to be switchable between two resistance states by an electric pulse applied to the memory element DS. In some embodiments, the memory element DS may include a phase-change material of which a crystal state is changed depending on the amount of a current. In other embodiments, the memory element DS may include perovskite compounds, transition metal oxides, magnetic materials, ferromagnetic materials, or antiferromagnetic materials.

Each of the lower electrodes BEC may be disposed between each of the first and second semiconductor patterns PT1 and PT2 and one of the memory elements DS. A planar area of the lower electrode BEC may be smaller than a planar area of each of the first and second semiconductor patterns PT1 and PT2 or a planar area of the memory element DS.

In some embodiments, the lower electrode BEC may have a pillar-shape. In other embodiments, the lower electrode BEC may be modified to one of various shapes capable of reducing a planar area thereof. For example, the lower electrode BEC may have a three-dimensional structure such as a U-shaped structure, an L-shaped structure, a hollow cylinder structure, a ring structure, or a cup structure.

Additionally, an ohmic layer may be disposed between each of the lower electrodes BEC and each of the first and second semiconductor patterns PT1 and PT2 for reducing a contact resistance. For example, the ohmic layer may include a metal silicide such as a titanium silicide, a cobalt silicide, a tantalum silicide, and/or a tungsten silicide.

Figure 19:
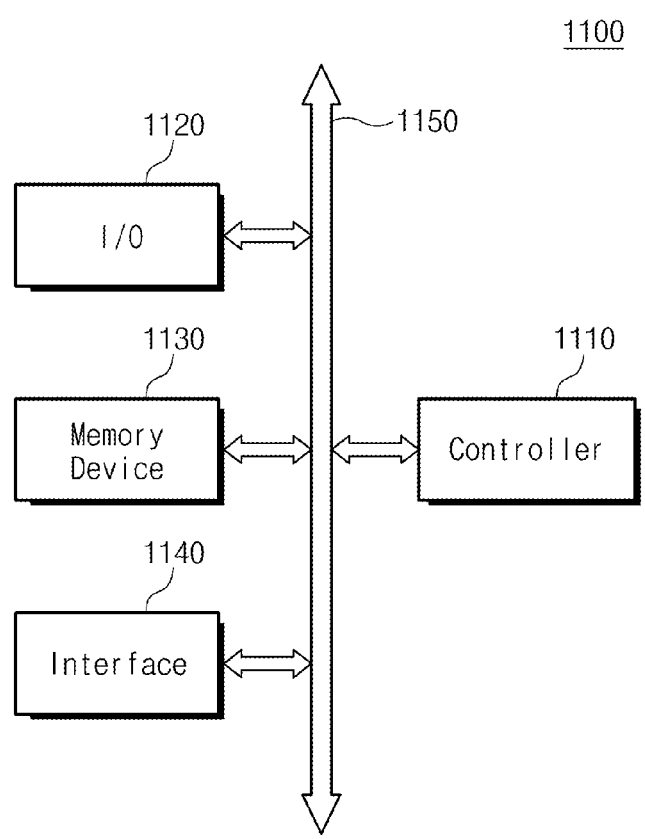
FIG. 19 is a schematic block diagram illustrating an example of electronic systems including the semiconductor devices formed using a method for forming fine patterns according to an example embodiment of the inventive concepts.

FIG. 19 is a schematic block diagram illustrating an example of electronic systems including the semiconductor devices formed using a method for forming fine patterns according to an example embodiment of the inventive concepts.

Referring to FIG. 19, an electronic system 1100 according to an example embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices. Other logic devices may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one of the semiconductor memory devices according to the example embodiments described above. The memory device 1130 may further include at least one of other types of semiconductor memory devices which are different from the semiconductor devices described above. For example, the memory device 1130 may further include a magnetic memory device, a phase change memory device, a dynamic random access memory (DRAM) device and/or a static random access memory (SRAM) device.

The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

According to some example embodiments of the inventive concepts, the fine patterns arranged in zigzag form may be formed using line and space patterns. Additionally, preventing or inhibiting undesirable distribution of overlay may be possible when photolithography processes are performed for forming the fine patterns. Thus, the fine patterns may be formed to be uniformly arranged in zigzag form. As a result, highly integrated semiconductor devices may be formed using the method for forming the fine patterns.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method comprising:
   forming first hard mask patterns and second hard mask patterns extending in a first direction on a lower layer, the first and second hard mask patterns repeatedly and alternately arranged;
   forming third mask patterns extending in a second direction perpendicular to the first direction on the first and second hard mask patterns;
   etching the first hard mask patterns using the third mask patterns to form first openings;
   forming filling patterns filling the first openings and gap regions between the third mask patterns;
   forming spacers on both sidewalls of each of the filling patterns after removing the third mask patterns; and
   etching the second hard mask patterns using the filling patterns and the spacers to form second openings.

2. The method of claim 1, wherein the etching the second hard mask patterns forms second openings in a diagonal direction from the first openings.

3. The method of claim 1, wherein the etching the first hard mask patterns forms a space between the first openings arranged in the first direction that is greater than a space between the first openings arranged in the second direction.

4. The method of claim 1, wherein the etching the second hard mask patterns forms distances between a center of the first opening and centers of the second openings adjacent to the first opening that are substantially equal to each other in a plan view.

5. The method of claim 1, further comprising:
   extending the first and second openings through the lower layer to form holes arranged in a zigzag form in the lower layer.

6. The method of claim 5, further comprising:
   filling each of the holes in the lower layer with a filling material; and
   removing the lower layer to form the fine patterns arranged in zigzag form.

7. The method of claim 1, wherein the forming first hard mask patterns and second hard mask patterns forms the first and second hard mask patterns to have widths substantially equal to each other.

8. The method of claim 1, wherein the forming third mask patterns forms the third mask patterns to have a width two or more times greater than a width of one of the first hard mask patterns.

9. The method of claim 1, wherein the forming first hard mask patterns and second hard mask patterns includes:
   repeatedly forming the first hard mask patterns on the lower layer, the first hard mask patterns having a first pitch, and
   forming the second hard mask patterns to fill gap regions between the first hard mask patterns.

10. The method of claim 9, wherein
    the repeatedly forming forms the first hard mask patterns to have an etch selectivity with respect to the lower layer, and
    the forming forms the second hard mask patterns to have an etch selectivity with respect to the lower layer.

11. The method of claim 10, wherein the forming first hard mask patterns and second hard mask patterns forms the first hard mask patterns and the second hard mask patterns including materials different from each other.

12. The method of claim 9, wherein the forming third mask patterns forms the third mask patterns with a second pitch which is two or more times greater than the first pitch.

13. The method of claim 1, wherein the forming spacers includes:
    removing the third mask patterns to form trenches in the substrate after the etching the first hard mask patterns, the trenches locally exposing top surfaces of the first and second hard mask patterns,
    forming a spacer layer conformally covering the substrate having the trenches, and
    anisotropically etching the spacer layer until the top surfaces of the first and second hard mask patterns are locally exposed.

14. The method of claim 13, wherein the etching the second hard mask patterns controls a distance between the first opening and the second opening adjacent to each other by a thickness of the spacer layer.

15. The method of claim 13, wherein the forming a spacer layer forms the spacer layer to have a thickness that is less than a width of the filling pattern and greater than a half of the width of the filling pattern.

16. A method for forming fine patterns, comprising:
    forming a lower layer on a substrate;
    forming a buffer mask layer on a lower layer;
    forming first and second mask patterns on the buffer mask layer;
    etching the first and second mask patterns to form openings;
    etching the buffer mask layer using the first and second mask patterns to form a buffer mask pattern;
    etching the lower layer using the buffer mask pattern to form a lower pattern exposing the substrate, the lower pattern including holes arranged in a zigzag form on the substrate; and
    filling the holes in the lower pattern with a filling material before removing the lower pattern.

17. The method of claim 16, wherein the etching the first and second mask patterns includes:
    forming third mask patterns on the first and second mask patterns;
    etching the first mask patterns using the third mask patterns to form first openings;
    forming filling patterns filling the first openings and gap regions between the third mask patterns;
    forming spacers on both sidewalls of each of the filling patterns after removing the third mask patterns; and
    etching the second mask patterns using the filling patterns and the spacers to form second openings.

18. The method of claim 17, wherein the forming third mask patterns forms the third mask patterns to have a width two or more times greater than a width of one of the first mask patterns.

19. The method of claim 16, wherein the forming first and second mask patterns forms the first and second mask patterns to have widths substantially equal to each other.

20. The method of claim 16, wherein the forming first and second mask patterns forms the first mask patterns and the second mask patterns including materials different from each other.

* * * * *